United States Patent
Shor et al.

(10) Patent No.: US 7,148,739 B2
(45) Date of Patent: Dec. 12, 2006

(54) CHARGE PUMP ELEMENT WITH BODY EFFECT CANCELLATION FOR EARLY CHARGE PUMP STAGES

(75) Inventors: Joseph S. Shor, Tel Mond (IL); Eduardo Maayan, Kfar Saba (IL)

(73) Assignee: Saifun Semiconductors Ltd., Netanya (IL)

( * ) Notice: Subject to any disclaimer, the term of this patent is extended or adjusted under 35 U.S.C. 154(b) by 0 days.

(21) Appl. No.: 10/322,491

(22) Filed: Dec. 19, 2002

(65) Prior Publication Data

US 2004/0119525 A1 Jun. 24, 2004

(51) Int. Cl.
*G05F 3/02* (2006.01)

(52) U.S. Cl. ........................ 327/536; 327/537
(58) Field of Classification Search ................ 327/534, 327/536, 537; 363/59
See application file for complete search history.

(56) References Cited

U.S. PATENT DOCUMENTS

| | | | | |
|---|---|---|---|---|
| 5,029,063 A | * | 7/1991 | Lingstaedt et al. | 363/60 |
| 5,081,371 A | * | 1/1992 | Wong | 363/60 |
| 5,636,288 A | | 6/1997 | Bonneville et al. | |
| 5,717,581 A | * | 2/1998 | Canclini | 327/536 |
| 5,726,946 A | | 3/1998 | Yamagata et al. | |
| 5,847,441 A | | 12/1998 | Cutter et al. | |
| 5,880,620 A | * | 3/1999 | Gitlin et al. | 327/534 |
| 5,903,031 A | | 5/1999 | Yamada et al. | |
| 5,963,412 A | | 10/1999 | En | |
| 6,028,324 A | | 2/2000 | Su et al. | |
| 6,064,251 A | | 5/2000 | Park | |
| 6,081,456 A | | 6/2000 | Dadashev | |
| 6,130,574 A | * | 10/2000 | Bloch et al. | 327/536 |
| 6,198,342 B1 | * | 3/2001 | Kawai | 327/536 |
| 6,208,200 B1 | * | 3/2001 | Arakawa | 327/589 |
| 6,297,974 B1 | * | 10/2001 | Ganesan et al. | 363/60 |
| 6,353,356 B1 | * | 3/2002 | Liu | 327/536 |
| 6,359,501 B1 | * | 3/2002 | Lin et al. | 327/536 |
| 6,400,209 B1 | * | 6/2002 | Matsuyama et al. | 327/534 |
| 6,452,438 B1 | * | 9/2002 | Li | 327/536 |
| 2002/0145464 A1 | | 10/2002 | Shor et al. | |

FOREIGN PATENT DOCUMENTS

EP         0693781         1/1996

OTHER PUBLICATIONS

Martin, *Improved Circuits for the Realization of Switched-Capacitor Filters*, IEEE Transactions on Circuits and Systems, Apr. 1980, vol. CAS–27, pp. 237–244.

Umezawa, et al., *A 5–V–Only Operation 0.6–µm Flash EEPROM with Row Decoder Scheme in Triple–Well Structure*, IEEE Journal of Solid State Circuits, vol. 27, 1992, p1540–1545.

* cited by examiner

*Primary Examiner*—Terry D. Cunningham
(74) *Attorney, Agent, or Firm*—Eitan Law Group

(57) ABSTRACT

A charge pump stage comprising a pulse train which injects energy into a gate of a charge transfer transistor of the charge pump stage, wherein a modified output of the pulse train is input to a bulk of the charge transfer transistor such that a bulk voltage of the charge transfer transistor is raised to a level not greater than the minimum of a source voltage and a drain voltage of that charge transfer transistor. A method for operating the charge pump stage is also disclosed.

12 Claims, 5 Drawing Sheets

CHARGE PUMP ELEMENT WITH BODY EFFECT CANCELLATION FOR EARLY CHARGE PUMP STAGES

FIELD OF THE INVENTION

The present invention relates generally to charge pumps for boosting voltages in microelectronic circuitry, and particularly to a charge pump stage architecture with body effect minimization.

BACKGROUND OF THE INVENTION

Non-volatile memory arrays, such as erasable, programmable read only memory (EPROM) or flash memory arrays, or electrically erasable, programmable read only memory (EEPROM) arrays, require high positive or negative voltages to program and erase memory cells of the array. Typically, these voltages are higher than the voltage supplied (Vdd). Charge pumps are generally used to boost on-chip voltages above the supply voltage Vdd to reach the voltages required for programming or erasing.

A charge pump typically comprises cascaded stages that progressively boost the voltage to higher levels. The charge pump functions by progressively storing more charge on a capacitor which is part of a capacitor-diode combination, with several such stages being placed together in a network to obtain the desired increase in voltage. The diode functions to prevent discharge of the capacitor prior to placing the additional charge thereon.

Reference is now made to FIGS. 1 and 2, which respectively illustrate four stages and a single stage of a commonly used charge pump architecture, called a four-phased-clock, threshold-voltage-canceling pump architecture, for a four-stage charge pump (see Umezawa, IEEE Journal of Solid State Circuits, Vol. 27, 1992, page 1540).

The charge pump circuit includes a plurality of charge transfer transistors (reference letters $m_i$) connected in series. In FIG. 1, four such charge transfer transistors are shown, labeled $m_1$, $m_2$, $m_3$ and $m_4$. In FIG. 2, which shows a single stage, one charge transfer transistor $m_i$ is shown. Charge transfer transistors $m_i$ may use, but are not limited to, CMOS (complementary metal oxide semiconductor) technology, being either n-channel or p-channel (NMOS or PMOS) field effect transistors (FETs). FIGS. 1 and 2 illustrate a positive charge pump based on NMOS. It is noted that NMOS is generally used to pump positive voltages, whereas PMOS is generally used to pump negative voltages. The charge transfer transistors have a control electrode (gate, labeled g), a first electrode (drain, labeled d) and a second electrode (source, labeled s), connected to nodes, as described hereinbelow. (Since MOSFETs are typically symmetrical components, the true designation of "source" and "drain" is only possible once a voltage is impressed on the terminals of the transistors. The designations of source and drain throughout the specification should be interpreted, therefore, in the broadest sense.) Preferably, the bulks (labeled b) of the charge transfer transistors $m_i$ are coupled to a reference line REF (FIG. 2) for receiving a reference voltage, generally ground in the case of NMOS.

Referring to FIG. 1, the source of charge transfer transistor $m_1$ is connected to node $n_0$, which is connected to Vdd. The gate of charge transfer transistor $m_1$ is connected to node $g_1$, and the drain is connected to node $n_1$. (In the general single stage shown in FIG. 2, the source of charge transfer transistor mi is connected to node $n_{i-1}$ the gate is connected to node $g_i$, and the drain is connected to node $n_i$.)

The source of charge transfer transistor $m_2$ is connected to node $n_1$, the gate is connected to node $g_2$, and the drain is connected to node $n_2$. Similarly, the source of charge transfer transistor $m_3$ is connected to node $n_2$, the gate to node $g_3$, and the drain to node $n_3$. Likewise, the source of charge transfer transistor $m_4$ is connected to node $n_3$, the gate to node $g_4$, and the drain to node $n_4$.

Two-phase pulse trains PH1 and PH2, and PH1A and PH2A are provided (FIG. 1), such as from a pulse generator (not shown). The PH1 and PH1A phases may be non-overlapping with respect to each other, and the PH2 and PH2A phases may be non-overlapping with respect to each other. The PH1 and PH2 phase may be overlapping. By non-overlapping it is meant that 0 to 1, and 1 to 0 voltage transitions of one pulse never overlap with the transitions of the other pulse. The PH1 and PH2 phases inject energy into the pump through large capacitors 5 into nodes $n_i$. Accordingly, in the illustrated embodiment, a large capacitor 5 is connected from pulse train PH1 to node $n_1$, and another large capacitor 5 is connected from pulse train PH1 to node $n_3$. Another large capacitor 5 is connected from pulse train PH2 to node $n_2$, and another large capacitor 5 is connected from pulse train PH2 to node $n_4$. The charge is transferred along the pump through charge transfer transistors $m_i$ connecting node $n_i$ to node $n_{i+1}$. (In the general single stage shown in FIG. 2, large capacitor 5 is connected from pulse train PH to node $n_i$.)

The PH1A and PH2A phases inject energy into the pump through small capacitors 11 into nodes $g_i$. Capacitors 11 preferably have a much smaller capacitance than large capacitors 5. In the illustrated embodiment a small capacitor 11 is connected from pulse train PH1A to node $g_2$, and another small capacitor 11 is connected from pulse train PH1A to node $g_4$. Another small capacitor 11 is connected from pulse train PH2A to node $g_1$, and another small capacitor 11 is connected from pulse train PH2A to node $g_3$. (In the general single stage shown in FIG. 2, small capacitor 11 is connected from pulse train PHA to node $g_i$.)

As seen in FIGS. 1, a plurality of auxiliary transistors $t_i$ (i.e., $t_1$, $t_2$, $t_3$ and $t_4$) are provided. In FIG. 2, which shows a single stage, one auxiliary Transistor $t_i$ is shown. Each auxiliary transistor $t_i$ has its drain connected to the gate node $g_i$ of each charge transfer transistor $m_i$ (i.e., $m_1$, $m_2$, $m_3$ and $m_4$, respectively, in FIG. 1). The source of each auxiliary transistor $t_i$ is connected to the source of each charge transfer transistor $m_i$ (i.e., node $n_{i-1}$). The gate of each auxiliary transistor $t_i$ is connected to the drain of each charge transfer transistor $m_i$ (i.e., node $n_i$). The bulk of each auxiliary transistor $t_i$ is connected to the bulk of each charge transfer transistor $m_i$, which is generally grounded. The auxiliary transistors $t_i$ and the PH1A and PH2A phases (PHA in the single stage shown in FIG. 2) and small capacitors 11 may control the gate voltage of the charge transfer transistors $m_i$.

The operation of the first stage of the pump is now explained, with all subsequent stages operating in the same manner. The operation commences with the PH1 phase starting to rise. Initially, charge transfer transistors $m_1$ and $m_2$ are non-conducting (i.e., turned off), since the PH1A and PH2A phases are in their low phase. The PH1 phase then fully rises and injects energy into node $n_1$, raising (or "pushing") node $n_1$ to a voltage boosted above Vdd, such as 2 Vdd. The rise of node $n_1$ forces node $g_1$ to Vdd through auxiliary transistor $t_1$. Since the source of charge transfer transistor $m_1$ is connected to Vdd at node no, the gate-source voltage bias $V_{gs}$ of charge transfer transistor $m_1$ is zero, assuring that transistor $m_1$ is turned off.

After a short time, typically in the order of several nanoseconds, the PH1A phase rises, which makes charge transfer transistor $m_2$ conduct (i.e., turns on). During this time, node $n_1$ is at a higher voltage than node $n_2$. Since, as just mentioned, charge transfer transistor $m_2$ is conducting, charge is transferred from node $n_1$ to node $n_2$. During the next phase, the PH2 phase rises and the PH1 phase drops. This causes node $n_1$ to drop and node $n_2$ to rise, thereby causing charge to be transferred from node $n_2$ to node $n_3$. In this manner charge is transferred along the pump. Each of the $g_i$ nodes is raised by a Vdd level with respect to the $n_i$ nodes when charge transfer is taking place. In the latter stages of the pump, the source and drain nodes (i.e., nodes $n_3$ and $n_4$) are raised well above the bulk, which is usually grounded.

In the more general case of a single stage, shown in FIG. 2, the charge is injected into the stage when the PH signal of the previous stage is high, and is transferred across the charge transfer transistor $m_i$ when the PHA signal is high. Note that when comparing node $n_{i-1}$ to $n_i$, the average voltage of $n_i$ is greater than that of $n_{i-1}$. However, during the stage when charge is transferred from $n_{i-1}$ to $n_i$, the voltage of $n_{i-1}$ is briefly higher than that of $n_i$.

The large voltage difference between the high source/drain voltages and the low bulk voltage causes a problem, called the body or bulk effect, which is now explained. (The terms body and bulk are used interchangeably throughout the specification and claims.)

Positive charge pumps generally use NMOS transistors, and this requires the body of the charge transfer transistors to be at the lowest voltage, in general ground (GND). (Negative charge pumps have the opposite requirement, and PMOS transistors are generally used.) However, in positive charge pumps there can be a significant loss of energy in the latter pump stages due to the "body effect". In NMOS, the body effect causes an increase in the threshold voltage ($V_t$), due to the fact that the bulk or body of the transistor is at a lower voltage than the source. Due to the body effect, the threshold voltage $V_t$ of the NMOS transistors progressively increases from the stages near the input terminal of the charge pump to the stages near the output terminal. For example, in the prior art charge pump of FIG. 1, the threshold voltage $V_t$ of charge transfer transistors $m_i$ progressively increases from transistor $m_1$ to transistor $m_4$. In transistor $m_4$, as mentioned hereinabove, the source and drain nodes $n_3$ and $n_4$, have been raised well above the bulk. This reduces the efficiency of the charge pump, because the charge transfer through each stage decreases.

In some CMOS processes, such as triple-well and silicon-on-insulator (SOI), it is possible to raise the bulk of the NMOS charge transfer transistors above the grounded substrate, which would reduce the body effect by diminishing the voltage difference between the bulk and the source/drain. However, in the prior art, this entails certain risks. For example, if the bulk voltage is raised above the source or drain voltage, then parasitic bipolar transistors (typically found in CMOS processes) can turn on, which can cause either latchup or drain the charge from the pump.

In many circuits, not necessarily charge pumps, the bulk effect is eliminated by connecting the bulk node to the source node. This is not possible in a charge pump, however, because the "source" can be higher or lower than the "drain" by Vdd, depending upon the clock cycle. This would cause parasitic diodes to turn on, resulting in the unwanted bipolar transistor turn-on and latchup.

One method for compensating for the body effect is described in U.S. Pat. No. 6,064,251 to Park. Park uses charge pump stages coupled in series. Each charge pump is stage has two clock terminals that receive two phase shifted clock signals. The charge pump stages are configured so that adjacent charge pump stages receive different clock signals. The phases of the clock signals are such that the pump elements are boosted well above the threshold voltage $V_t$, thereby providing the transistors with sufficient overdrive to transfer energy along the pump. However, clock boosting uses a significant amount of power consumption and is thus very inefficient.

Another prior attempt to minimize the bulk effect is described in U.S. patent application Ser. No. 09/826,351, assigned to the same assignee of the present invention, the disclosure of which is incorporated herein by reference. This method is effective in the latter pump stages (from the fourth stage onwards). In this case, the bulk of the stage is boosted by a source follower circuit whose gate is connected to the output of a previous stage at a voltage V, boosting the bulk to $V-V_t$, where $V_t$ is the threshold voltage of the source follower.

FIG. 3 illustrates a single stage of the source follower circuit of U.S. patent application Ser. No. 09/826,351. NMOS charge transfer transistor $m_i$ has its source connected to node $n_{i-1}$, its gate connected to node $g_i$, and its drain connected to node $n_i$. Pulse train PH injects energy into the pump through large capacitor 5 connected to node $n_i$. Another pulse train PHA injects energy into the pump through small capacitor 11 into node $g_i$.

An auxiliary transistor $t_i$ has its drain connected to the gate node $g_i$ of charge transfer transistor $m_i$. The source of auxiliary transistor $t_i$ is connected to the source of charge transfer transistor $m_i$ (i.e., node $n_{i-1}$). The gate of auxiliary transistor $t_i$ is connected to the drain of charge transfer transistor $m_i$ (i.e., node $n_i$). The auxiliary transistor $t_i$ and the PHA phase control the gate voltage of the charge transfer transistor $m_i$. The P-well (PW) of the transistors is isolated from the P-substrate, such as by a triple well process.

An additional transistor $s_i$ is preferably configured as a source follower. A source follower is a method of configuring a FET, wherein the output voltage is at the source, and it "follows" the input voltage, which is connected to the gate. By "following" it is meant that the output voltage equals the input voltage minus the threshold voltage. The input of the source follower $s_i$ is from a previous pump stage and is used to drive the bulk of a subsequent pump stage.

In the circuitry of FIG. 3, the gate of source follower $s_i$ is connected to the drain of charge transfer transistor $m_{i-2}$. The source and bulk of source follower $s_i$ are connected to the bulk of charge transfer transistor $m_i$ and to the bulk of auxiliary transistor $t_i$ via a node $p_i$ and a node $q_i$. Node $p_i$ may be connected to a bleeder element 12, which may be, without limitation, a current source. The drain of source follower $s_i$ is connected to a high voltage, such as at a node $w_i$, which may be the pump output or the stage output or input, for example The disadvantage of this method is that it only provides a solution for the latter pump stages. In the earlier stages, there is also a significant bulk effect, which can deteriorate the pump's efficiency. There is accordingly a need for a method to efficiently compensate for the bulk effect in the early pump stages, without opening the parasitic bipolar transistors.

SUMMARY OF THE INVENTION

The present invention provides a novel charge pump stage for pumping high positive voltages, which minimizes the abovementioned body effect. In the present invention, the method may boost the bulk voltage at any stage, even at the early pump stages.

There is thus provided hi accordance with an embodiment of the present invention a method for operating a charge pump, the method comprising providing a pulse train which injects energy into a charge pump stage to a gate of a charge transfer transistor of the charge pump stage, and inputting a modified output from the pulse train to a bulk of the charge transfer transistor such that a bulk voltage of the charge transfer transistor is raised to a level not greater than the minimum of a source voltage and a drain voltage of that charge transfer transistor.

In accordance with an embodiment of the present invention the bulk voltage of the charge pump stage is raised to a level below a minimum of source/drain voltages of a charge transfer transistor at that stage.

Further in accordance with an embodiment of the present invention modifying the output comprises connecting the pulse train to an input of a first inverter, which outputs to a second inverter, wherein an output of the second inverter is connected to the bulk of the charge transfer transistor.

Still further in accordance with an embodiment of the present invention the method comprises providing an n-channel metal oxide semiconductor (NMOS) transistor, wherein a source of the NMOS transistor is connected to a positive supply of the second inverter, a gate of the NMOS transistor is connected to the drain of the charge transfer transistor, and a drain of the NMOS transistor is connected to a supply voltage (Vdd) of the charge pump stage.

In accordance with an embodiment of the present invention the source voltage of the NMOS transistor (Vs) is the minimum of Vdd and the difference between the voltage of the stage output and the threshold voltage of the NMOS transistor.

Further in accordance with an embodiment of the present invention the bulk of the NMOS transistor is connected to its source.

There is also provided in accordance with an embodiment of the present invention a charge pump stage comprising a pulse train which injects energy into a gate of a charge transfer transistor of the charge pump stage, wherein a modified output or the pulse train is input to a bulk of a charge transfer transistor such that a bulk voltage off the charge transfer transistor is raised to a level not greater than the minimum of a source voltage and a drain voltage of that charge transfer transistor.

BRIEF DESCRIPTION OF THE DRAWINGS

The present invention will be understood and appreciated more fully from the following detailed description taken in conjunction with the drawings in which:

FIGS. 1 and 2 are simplified circuit diagrams of a charge pump architecture commonly used in the prior art, comprising a threshold-voltage-canceling four-phased charge pump, wherein FIG. 1 illustrates four stages of the charge pump and FIG. 2 illustrated a single stage of the charge pump;

DETAILED DESCRIPTION OF A PREFERRED EMBODIMENT

Figure 1:
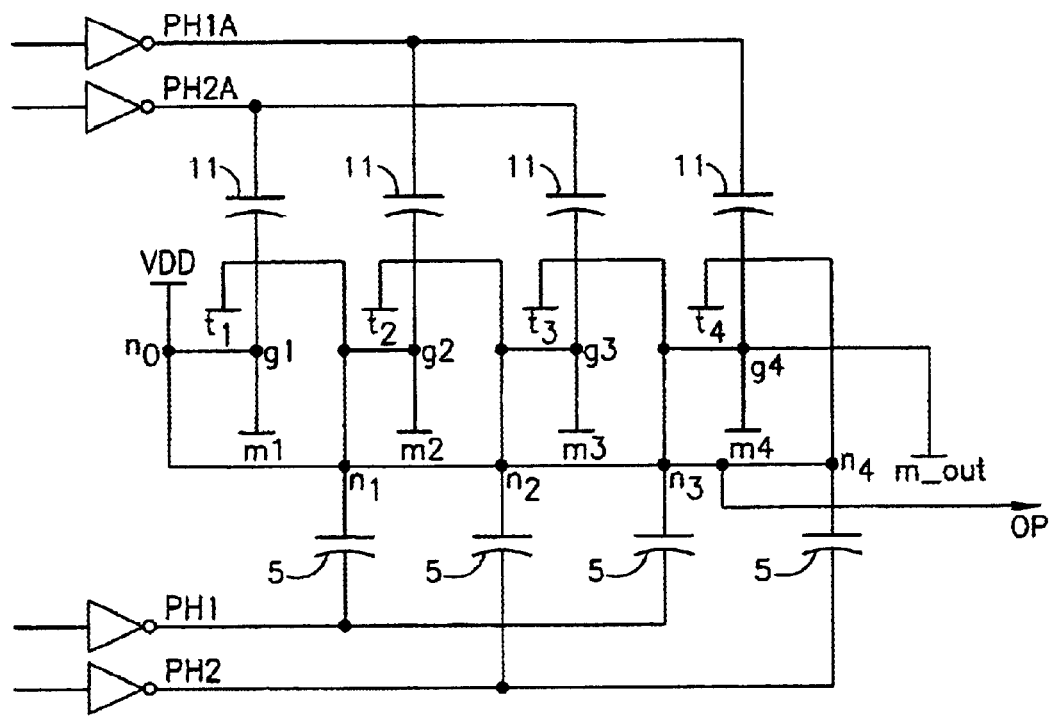
Figure 1:
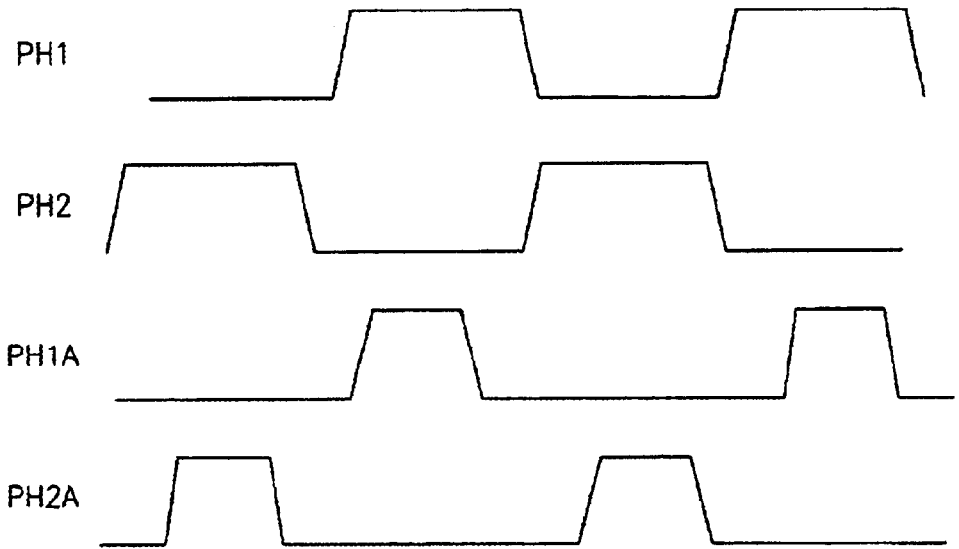
Figure 2:
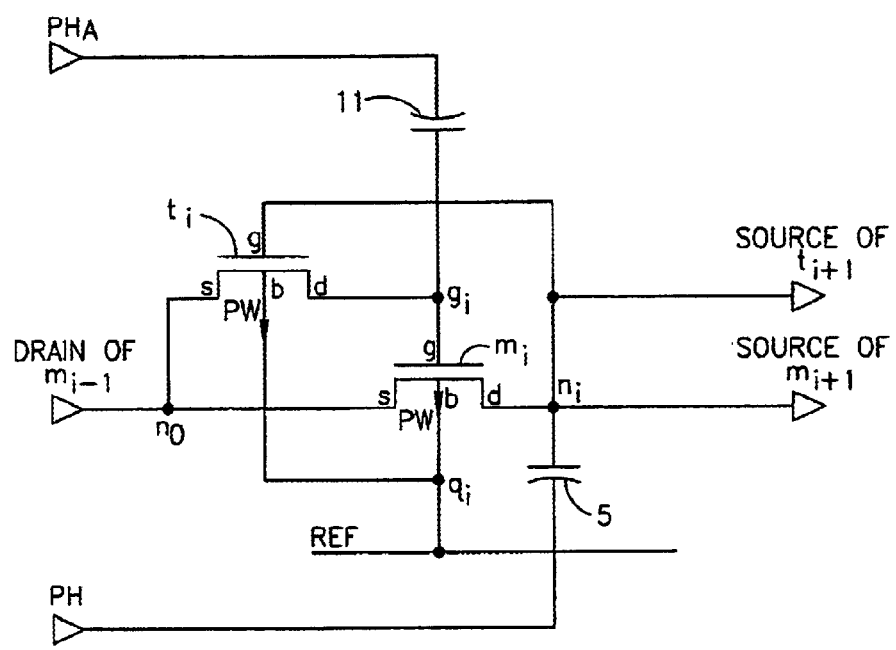
Figure 3:
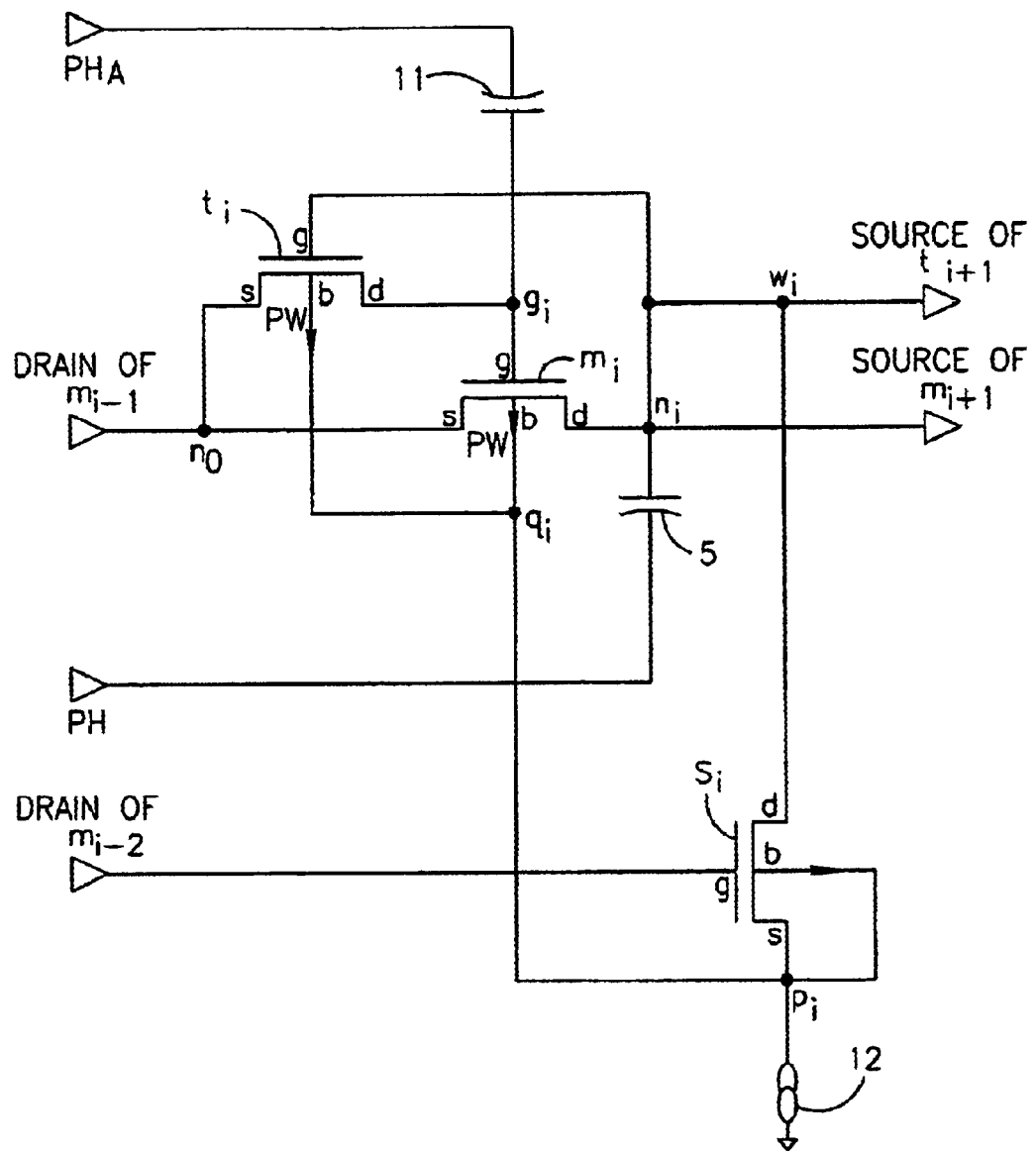
FIG. 3 is a simplified circuit diagram of a charge pump stage with a boosted well of the prior art, wherein the bulk of the stage is boosted by a source follower circuit.
Figure 4:
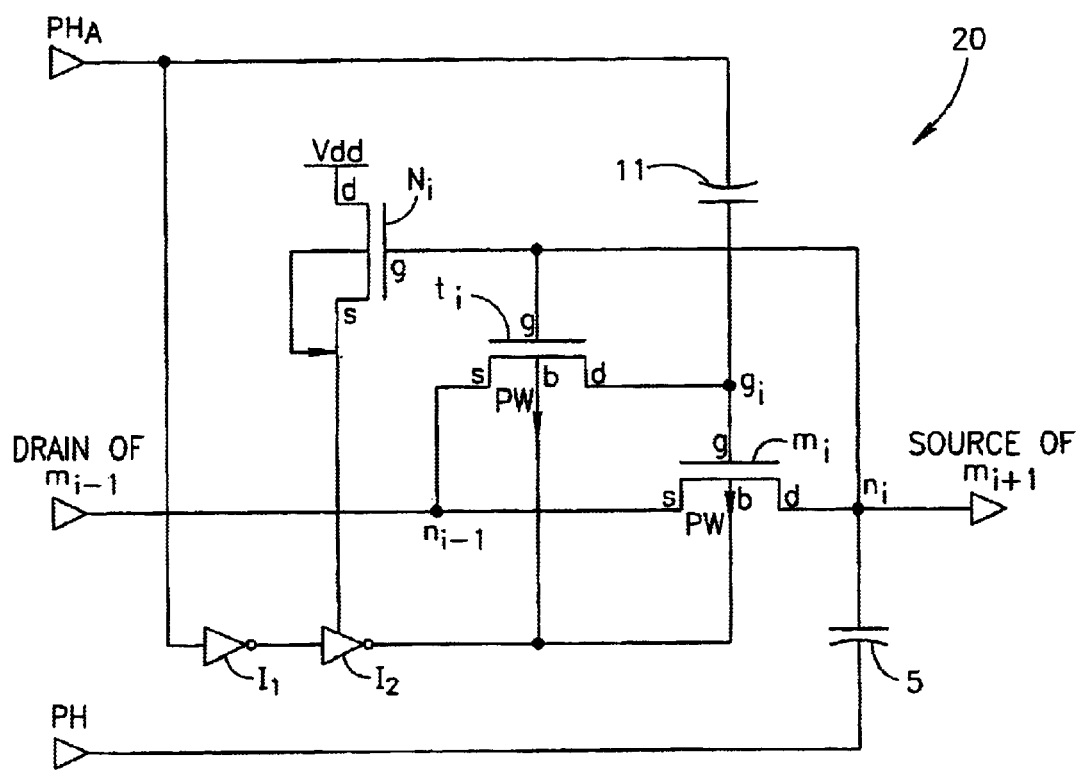
In FIG. 4 is a simplified circuit diagram of a charge pump stage with a boosted well, constructed and operative in accordance with an embodiment of the present invention.

Reference is now made to FIG. 4, which illustrates a charge pump stage 20 with a boosted well, constructed and operative in accordance with an embodiment of the present invention. FIG. 4 illustrates a single stage, but it is readily understood that the invention may comprise multiple stages connected to one another, In charge pump stage 20, NMOS charge transfer transistor $m_i$ has its source connected to node $n_{i-1}$, its gate connected to node $g_i$, and its drain connected to node $n_i$. Pulse train PH injects energy into the pump through large capacitor 5 connected to node $n_i$. Another pulse train PHA injects energy into the pump through small capacitor 11 into node $g_i$.

An auxiliary transistor $t_i$ has its drain connected to the gate node $g_i$ to charge transfer transistor $m_i$. The source of auxiliary transistor $t_i$ is connected to the source of charge transfer transistor $m_i$ (i.e., node $n_{i-1}$). The gate of auxiliary transistor $t_i$ is connected to the drain of charge transfer transistor $m_i$ (i.e., node $n_i$). The auxiliary transistor $t_i$ and the PHA phase pulse train control the gate voltage of the charge transfer transistor $m_i$.

The P-well (PW) of charge transfer transistor $m_i$, as well as the PW of auxiliary transistor $t_i$, is preferably isolated from the P-substrate, which may be accomplished with triple-well technology. However, other transistor;architectures may be used to carry out the invention other than triple-well technology. For example, the P-well may be isolated from the P-substrate by an SOI structure, such as but not limited to, an SOS (silicon-on-sapphire) structure formed by heteroepitaxy of silicon on a monocrystalline sapphire substrate by CVD (chemical vapor deposition). Another example is that of SIMOX (separation by ion-implanted oxygen) in which a silicon dioxide layer is formed by ion implantation of oxygen into a silicon monocrystalline substrate.

In accordance with an embodiment or the invention, charge pump stage 20 may comprise an NMOS transistor $N_i$, and inverters I1 and I2. The source of transistor $N_i$ may be connected to Vdd, which generally is the supply voltage to the particular charge pump stage. The drain of transistor $N_i$ may be connected to the positive supply of inverter I2. The gate of transistor $N_i$ may be connected to the stage output, which for the single stage shown in FIG. 4, may be connected to the source of the charge transfer transistor $m_{i+1}$ of the next stage. Pulse train PHA is connected to the input of inverter I1. which outputs to inverter I2. The output of inverter I2 is connected to the bulk of charge transfer transistor $m_i$. Accordingly, a modified output of pulse train PHA is input to the bulk of charge transfer transistor $m_i$. The bulk of transistor $N_i$ may be optionally connected to its source.

The voltage at the source of transistor $N_i$ is designated as Vs. Vs is the minimum of Vdd (the positive rail) and the difference between the voltage of the stage output (tile drain of the charge transfer transistor $m_i$ of the present stage at node $n_i$, which leads to the source of the charge transfer transistor $m_{i+1}$, of the next stage) and the threshold voltage $(V_t)$ of the charge transfer transistor $m_i$ of the present stage. Accordingly, in the preceding nomenclature, Vs=MIN (Vdd, $V_{ni-Vt}$).

As mentioned hereinabove, during the charge transfer stage the pulse train PHA is high. Alter inversion by inverter I1, the input to inverter I2 is a logic low, which means the output of inverter I2 is driven to Vs. As mentioned previously, the output of inverter I2 is connected to the bulk of charge transfer transistor $m_i$. Thus, during the charge transfer stage, the bulk of charge transfer transistor mi is boosted to Vs, which is the minimum of Vdd and the difference between the voltage of the stage output and the threshold voltage (minimum of Vdd and $V_{ni}-V_t$). This may significantly reduce the bulk effect of charge transfer transistor $m_i$, and thus increase the efficiency of stage 20. The bulk voltage at no point can exceed either the source or drain voltages of any charge transfer transistor $m_i$, thus guaranteeing that no latchup or bipolar currents may be activated. Unlike the prior art, the boosting mechanism of the present invention does not depend on any outputs from prior stages, and may be applied to the all pump stages including the first pump stages. The additional components in the charge pump stage (transistor $N_i$, and inverters I1 and I2) may be of minimum size and thus may not occupy significant area or draw significant additional current. The gate of auxiliary transistor $t_i$ may be optionally connected to GND or to the PW of charge transfer transistor $m_i$ at node $v_i$.

Figure 5:
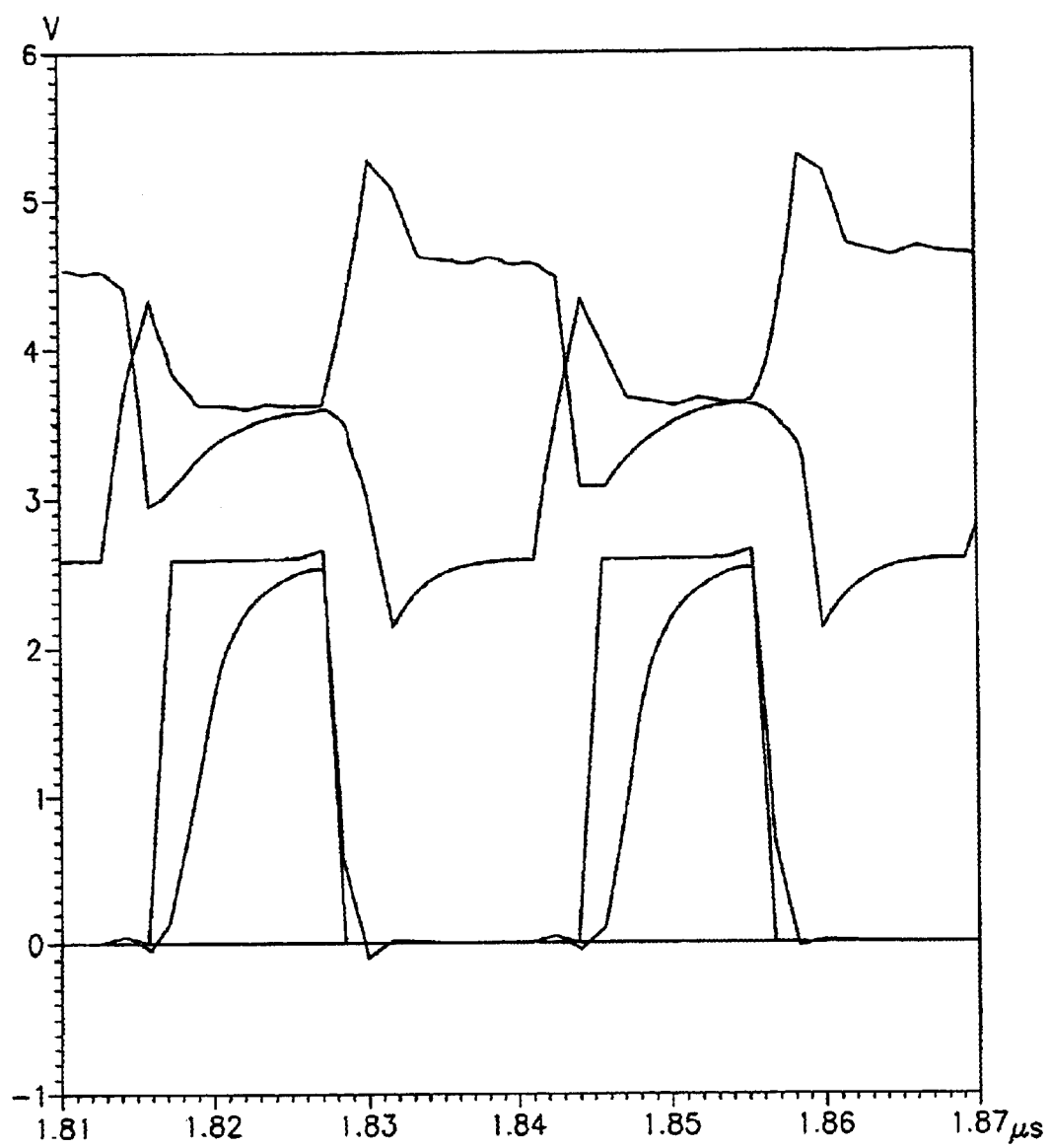
FIG. 5 is a simplified graphical illustration of simulated waveforms for the charge pump stage of FIG. 4, in accordance with a preferred embodiment of the present invention.

Reference is now made to FIG. 5, which illustrates simulated waveforms of the pump stage 20 of FIG. 4. FIG. 5 illustrates voltage levels at the source side of charge transfer transistor $m_i$ (nodes $n_{i-1}$ in FIG. 4) and the drain side of charge transfer transistor $m_i$ (node $n_i$ in FIG. 4). It is noted that when comparing node $n_{i-1}$ to node $n_i$, the average voltage of node $n_i$ is greater than that of node $n_{i-1}$. However, during the charge transfer phase, when PHA is high and charge is transferred from node $n_{i-1}$ to node $n_i$, the voltage of node $n_{i-1}$ is briefly higher than that of node $n_i$ for a short transient period, such transient periods being designated by reference numeral 15 in FIG. 5. During transient period 15, the well of charge transfer transistor $m_i$ may be boosted as described hereinabove, which results in a reduced bulk effect, and hence, more efficient charge transfer (node $n_{1-1}$>node $n_i$).

Accordingly, the voltage level of the bulk of each charge transfer transistor $m_i$ is raised to a level not greater than the minimum of the voltage level of the source and drain of that charge transfer transistor $m_i$. The architecture of the present invention ensures that the P-well/bulk of each charge pump stage is raised to a level less than or equal to the minimum, during the entire clock cycle, of the source/drain voltage at that stage, which minimizes the bulk effect, and at the same time ensures that no diodes are forward biased.

It will be appreciated by person skilled in the art, that the present invention is not limited by what has been particularly shown and described herein above. Rather the scope of the present invention is defined only by the claims which follow:

What is claimed is:

1. A method for operating a charge pump, the method comprising:

providing a pulse train into a charge pump stage, wherein said pulse train enables charge transfer through said charge pump stage in a high phase and blocks charge transfer through said charge pump stage in a low phase;

driving a bulk of a charge transfer transistor to a drain terminal voltage level of an n-channel metal oxide semiconductor (NMOS) transistor, said source terminal voltage level not greater than the minimum of a source voltage and a drain voltage of said charge transfer transistor in the high phase of said pulse train, wherein the gate of said NMOS transistor is connected to the drain of said charge transfer transistor, and the source of said NMOS transistor is connected to a positive supply voltage; and driving said bulk of said charge transfer transistor to substantially a ground potential level, said ground potential level lower than said drain terminal voltage level and not greater than the minimum of said source voltage and said drain voltage of said charge transfer transistor in the low phase of said pulse train.

2. The method according to claim 1, wherein said bulk of said charge transfer transistor is driven during substantially the entire operation of the charge pump stage.

3. The method according to claim 1, wherein the drain terminal voltage of said NMOS transistor is the minimum of a positive supply voltage and the difference between the voltage of an output of the charge pump stage and a threshold voltage of said NMOS transistor.

4. The method according to claim 3, wherein said positive supply voltage is Vdd.

5. The method according to claim 1, wherein said positive supply voltage is Vdd.

6. The method according to claim 1, wherein the bulk of said NMOS transistor is connected to the source of said NMOS transistor.

7. A charge pump stage comprising:

a charge transfer circuit to enable charge transfer through a charge pump stage in a high phase of a pulse train provided to said charge transfer circuit and to block charge transfer through said charge pump stage in a low phase of said pulse train provided to said charge transfer circuit;

a driver circuit to electrically couple a bulk of a charge transfer transistor in said charge transfer circuit to a drain terminal voltage level of an n-channel metal oxide semiconductor (NMOS) transistor, said drain terminal voltage level not greater than the minimum of a source voltage and a drain voltage of said charge transfer transistor in the high phase of said pulse train, wherein the gate of said NMOS transistor is connected to the drain of said charge transfer transistor, and the source of said NMOS transistor is connected to a positive supply voltage; and the driver circuit further to electrically couple said bulk of said charge transfer transistor substantially to a ground potential level, said ground potential level being lower than said drain terminal voltage level and not greater than the minimum of said source voltage and said drain voltage of said charge transfer transistor in the low phase of said pulse train.

8. The charge pump stage according to claim 7, wherein said bulk of said charge transfer transistor is driven during substantially the entire operation of the charge pump stage.

9. The charge pump stage according to claim 7, wherein the source terminal voltage of said NMOS transistor is the minimum of a positive supply voltage and the difference between the voltage of the stage output and the threshold voltage of said NMOS transistor.

10. The charge pump stage according to claim 9, wherein said positive supply voltage is Vdd.

11. The charge pump stage according to claim 7, wherein said positive supply voltage is Vdd.

12. The charge pump stage according to claim 7, wherein the bulk of said NMOS transistor is connected to the source of said NMOS transistor.

* * * * *